United States Patent
Biber et al.

(10) Patent No.: US 9,297,872 B2
(45) Date of Patent: Mar. 29, 2016

(54) DYNAMIC ADAPTATION OF A DEGREE OF SIGNAL COMPRESSION FOR MRT IMAGE PROCESSING

(71) Applicants: Stephan Biber, Erlangen (DE); Stephan Kannengießer, Wuppertal (DE)

(72) Inventors: Stephan Biber, Erlangen (DE); Stephan Kannengießer, Wuppertal (DE)

(73) Assignee: Siemens Aktiengesellschaft, München (DE)

( * ) Notice: Subject to any disclaimer, the term of this patent is extended or adjusted under 35 U.S.C. 154(b) by 145 days.

(21) Appl. No.: 14/088,386

(22) Filed: Nov. 23, 2013

(65) Prior Publication Data

US 2014/0161336 A1 Jun. 12, 2014

(30) Foreign Application Priority Data

Nov. 23, 2012 (DE) .......................... 10 2012 221 465

(51) Int. Cl.
*G06K 9/00* (2006.01)
*G01R 33/56* (2006.01)
G01R 33/3415 (2006.01)
G01R 33/561 (2006.01)

(52) U.S. Cl.
CPC ........ *G01R 33/5608* (2013.01); *G01R 33/3415* (2013.01); *G01R 33/5611* (2013.01)

(58) Field of Classification Search
None
See application file for complete search history.

(56) References Cited

U.S. PATENT DOCUMENTS

| | | |
|---|---|---|
| 2004/0193038 A1 | 9/2004 | Reykowski et al. |
| 2005/0151538 A1 | 7/2005 | Ichinose et al. |
| 2006/0284812 A1 | 12/2006 | Griswold et al. |
| 2007/0013375 A1 | 1/2007 | Akao et al. |
| 2010/0225317 A1 | 9/2010 | Biber |
| 2011/0241676 A1 | 10/2011 | Busse et al. |

FOREIGN PATENT DOCUMENTS

| | | |
|---|---|---|
| CN | 1640358 A | 7/2005 |
| DE | 102005018814 A1 | 11/2006 |
| DE | 102009012109 A1 | 9/2010 |

OTHER PUBLICATIONS

German Office Action in German Patent Application No. 10 2012 221 465.8, dated Oct. 4, 2013, with English translation.
Huang et al., "A Software Channel Compression Technique for Faster Reconstruction with Many Channels", Magnetic Resonance Imaging, 2008, pp. 133-141, 26 (2008).
(Continued)

*Primary Examiner* — Soo Park
(74) *Attorney, Agent, or Firm* — Lempia Summerfield Katz LLC

(57) ABSTRACT

An apparatus and a method for generating an image from N reception signal data sets of signals received by a plurality of coils of a magnetic resonance tomography appliance from a region of a body to be examined using an image processing computer are provided. The apparatus includes a degree-of-compression determining device. A ratio N/M of the number N of N reception signal data sets generated from the signals received by the plurality of coils to a smaller number M of mode data sets is defined taking account of a plurality of parameters. The plurality of parameters at least also represent system resources of the image processing computer. Using a compression computer, the N reception signal data sets are compressed into M mode data sets. After this, the M mode data sets are used by the image processing computer for generating the image of the region of the body.

29 Claims, 9 Drawing Sheets

(56) References Cited

OTHER PUBLICATIONS

Lin et al, "Fast Principal Component Analysis Based on Hardware Architecture of Generalized Hebbian Algorithm", Lecture Note in Computer Science, LNCS 6382, 2010, pp. 505-515, Springer-Verlag Berlin Heidelberg.

Moritz Berger, "Vergleich von Selektionskriterien für die Anzahl funktionaler Hauptkomponenten", Kapitel 3: Kriterien zur Wahl der Anzahl der Hauptkomponenten, Aug. 23, 2011, pp. 21-28; (ganze Bachelorarbeit hinterlegt pp. 1-71), http://epub.ub.uni-muenchen.de/12456/1/BA_Berger.pdf.

Tang et al., "Simultaneous Ultrasound and MRI System for Breast Biopsy: Compatibility Assessment and Demonstration in a Dual Modality Phantom", IEEE Transactions on Medical Imaging, Feb. 2008, pp. 247-254, vol. 27, No. 2.

Chinese Office Action for Chinese Patent Application No. 201310549729.X, mailed Dec. 2, 2015, with English Translation.

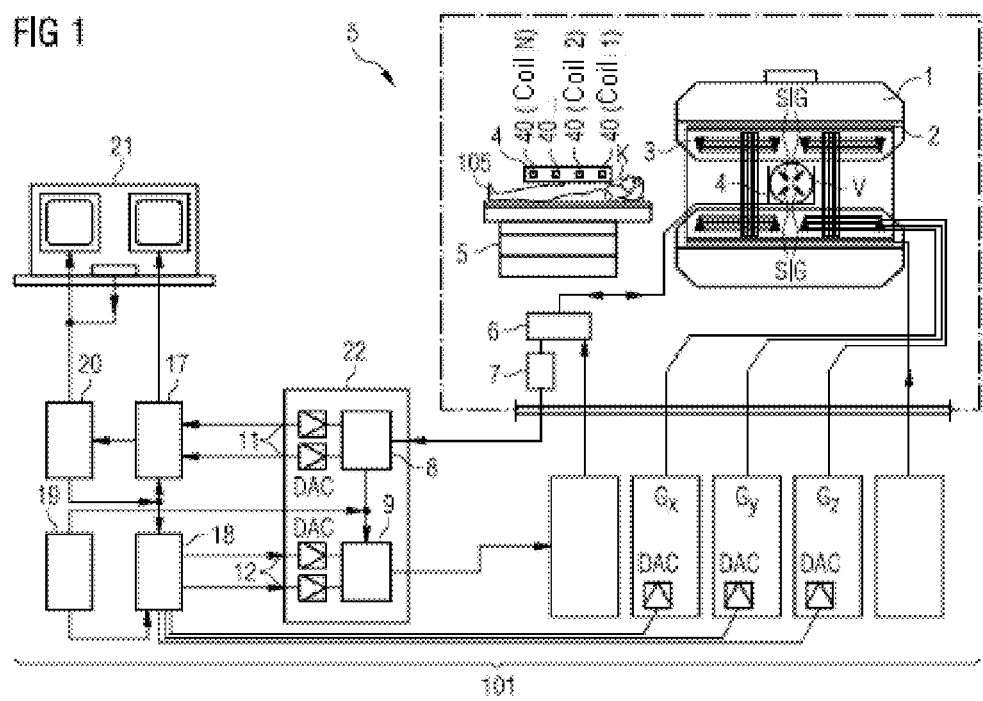

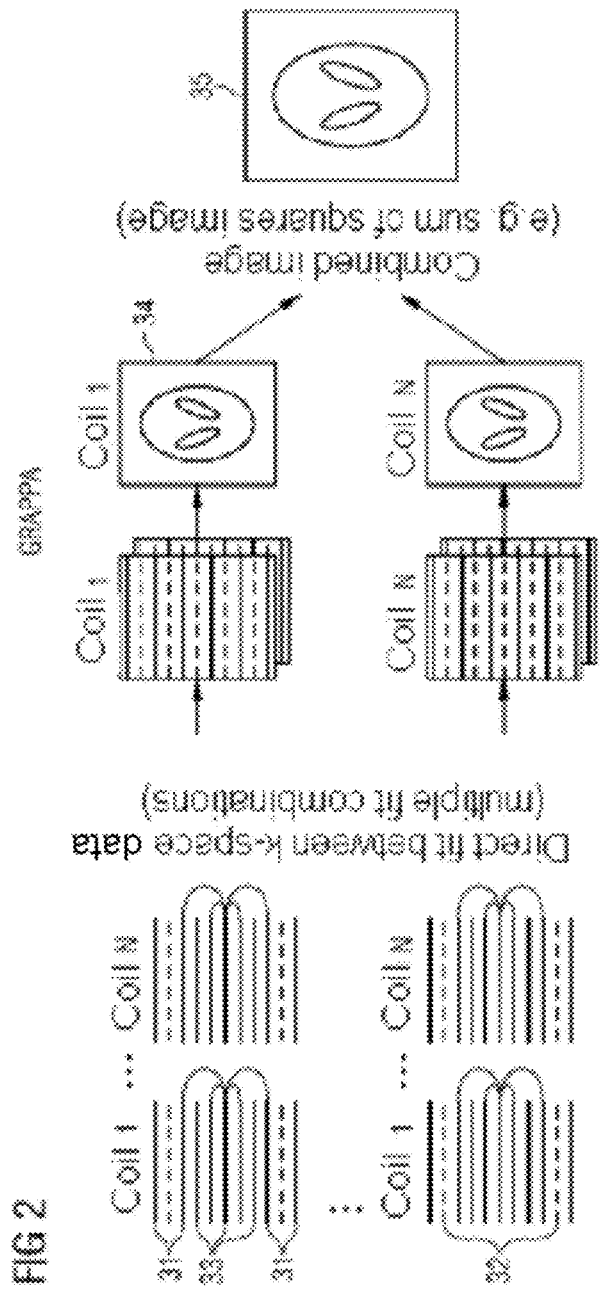

CHA: Diversity of channels = = signals of the component coils

- Measured lines
- Measured reference lines
- Non-measured (omitted) lines
- GRAPPA reconstructed lines x = GRAPPA reconstruction matrix
x̄ = Reducing GRAPPA reconstruction matrix (Reference lines were used for calculating
x, x̄; not illustrated)

▬ Measured lines
▬ Non-measured (omitted) lines
▨ GRAPPA reconstructed lines

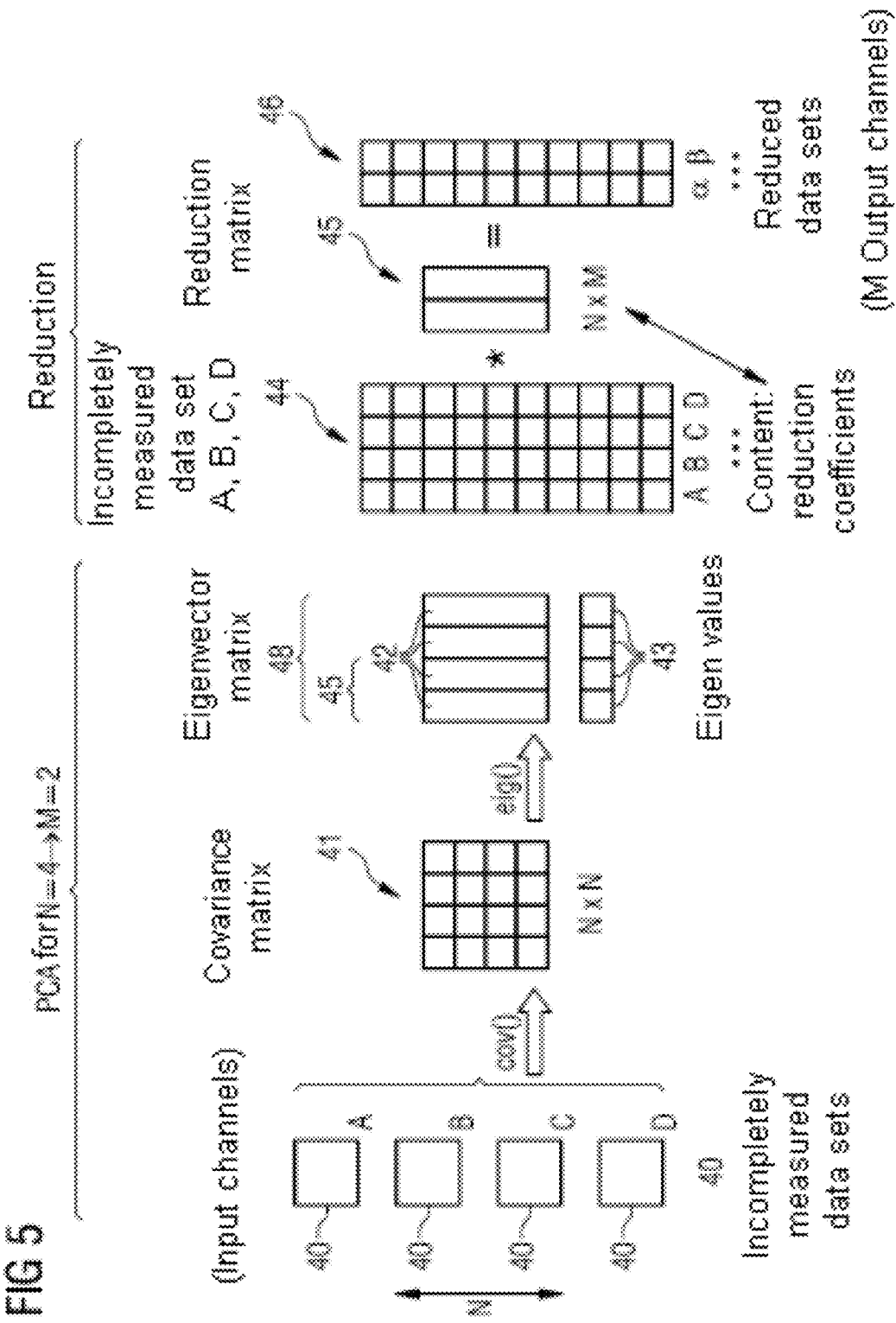

DYNAMIC ADAPTATION OF A DEGREE OF SIGNAL COMPRESSION FOR MRT IMAGE PROCESSING

This application claims the benefit of DE 10 2012 221 465.8, filed on Nov. 23, 2012, which is hereby incorporated by reference in its entirety.

BACKGROUND

The present embodiments relate to methods and apparatuses for magnetic resonance tomography (MRT) imaging.

Magnetic resonance tomography appliances (MRTs) and compression methods are known, for example, from DE102005018814A1, DE102009012109A1, "A software channel compression technique for faster reconstruction with many channels," by Huang, Vijayakumar, Li, Hertel, Duensing, Magnetic Resonance Imaging, and http://epub.ub.uni-muenchen.de/12456/1/BA_Berger.pdf (chapter 3).

SUMMARY

The scope of the present invention is defined solely by the appended claims and is not affected to any degree by the statements within this summary.

The present embodiments may obviate one or more of the drawbacks or limitations in the related art. For example, a magnetic resonance tomography (MRT) device is optimized.

BRIEF DESCRIPTION OF THE DRAWINGS

Further features and advantages of possible configurations are illustrated with the following description of exemplary embodiments with reference to the drawing, in which:

FIG. 1 shows a schematic illustration of a magnetic resonance tomography (MRT) appliance for carrying out the method;

FIG. 2 schematically shows the basic procedure of image reconstruction according to GRAPPA;

FIG. 5 schematically shows a PCA algorithm for determining a 4×2 reduction matrix;

DETAILED DESCRIPTION

Figure 3A:
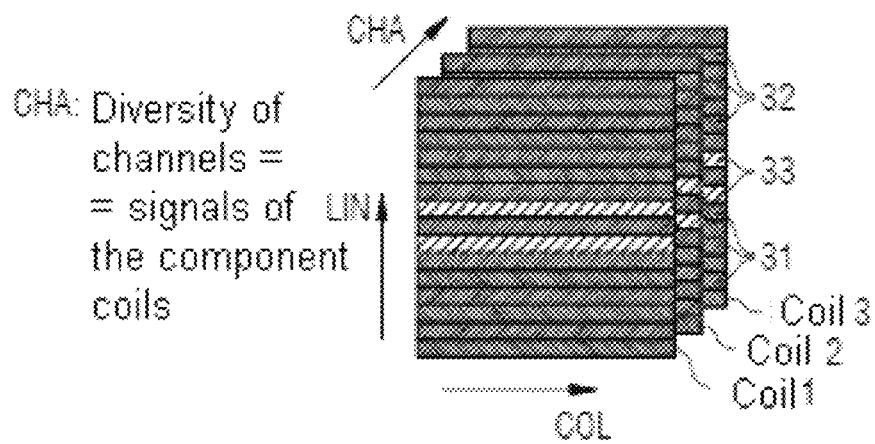
FIG. 3A shows a recording characteristic of a k-matrix in detail for three reduced data sets including reference lines.
Figure 3B:
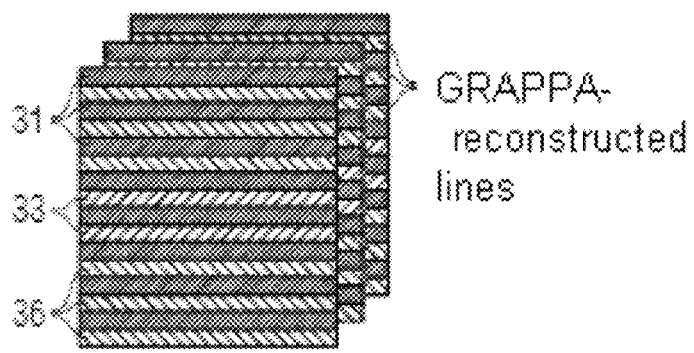
FIG. 3B shows the reconstructed (completed) data sets from FIG. 3A.

With the use of many-channel coils (e.g., in combination with parallel imaging (SENSE, GRAPPA, SMASH, etc.)), very high computing powers and memory capacities may be required. This produces costs in the design (e.g., of the main memory of the image reconstruction computer and also in the computing power thereof). Lower computing power gives rise to considerably longer waiting times for the reconstruction of the images. This may extend to the time range of, for example, three to twenty minutes, which may be undesirably long. Although the many-channel coils may accelerate the measurement time, the availability of the images is determined by the reconstruction time and not by the measurement time.

A method for compressing channels on the basis of prior knowledge (e.g., prescan measurement or calibration data) is described, for example, in DE 102005018814 A1, Griswold, Kannengiesser, Jellus or 2008E15617DE, Biber.

Principal component analysis (PCA), for example, is used in this case.

This is, for example, also described in a publication "A software channel compression technique for faster reconstruction with many channels," Huang, Vijayakumar, Li, Hertel, Duensing, Magnetic Resonance Imaging, and the works cited therein, and described in detail, for example, in an application by Griswold, Kannengiesser et al. DE102005018814A1. It is explained therein that the N input channels (e.g., from N coils of a coil array) may be compressed by multiplication by a compression matrix of size N×M to M "modes" (also designated here as further processing data sets or further processing channels) or, for example, in the case of PCA, also called "principal components." In this case, data may be compressed significantly (e.g., to compress N=32 coil channels to only M=16 principal components (see DE 102005018814A1, FIGS. 5, 6)), and in the process, a SNR loss averaged over the image of only a few percent is accepted.

This SNR compression appears to be acceptable in view of the fact that, when the channels are halved, the memory and computational requirement falls approximately by a factor of 2-4.

However, the previous publications appear to leave open the question of how many modes or principal components are to be used for further processing. This therefore concerns the determination of the number M of the size of the compression matrix. The criteria that may be used for determining the number M is not described in precise detail in DE 102005018814A1.

Diverse methods for selecting the number of principal components are known in the literature. In this respect, see, for example, Chapter 3 of http://epub.ub.uni-muenchen.de/12456/1/BA_Berger.pdf. However, these all relate to the development of a quality criterion that describes how much information is contained in a specific number of principal components.

In the context of the application for medical technology and, for example, for MRT, however, the technical boundary conditions also are to be concomitantly taken into account. The issue addressed involves what criteria may be used for selecting the number of principal components or modes and how the selection may contribute to optimally utilizing the hardware equipment of a system.

According to one known solution, the implementations of software compression methods with a version designated as VD13 are available. In this case, the number M of principal components is determined by one of the quality criteria described in http://epub.ub.uni-muenchen.de/12456/1/BA_Berger.pdf chapter 3.

Known software methods that restrict the parameterization of the measurement such that the available computing power or general MRT installation power (e.g., power of the RF amplifier, of the gradient amplifier as a function of time, amplitude and rise time) may be exceeded. For this purpose, a software component has models that may precalculate the power requirements made of the system depending on the measurement parameters and may thereby prevent the setting of measurement parameters that may not be realized technically. In this regard, for example, the available memory may also limit the number of measurable slices (e.g., in 3D imaging).

In accordance with configurations of one or more of the present embodiments, parameters may also be used as a criterion for the calculation of the degree of compression M/N (e.g., M principal components from N coil elements; M<N). The parameters may, for example, also represent system resources SR of an image processing computer such as for example, a memory SP of an image processing computer RECON that is available for the image reconstruction on the part of an image processing computer may affect the number of selected principal component or modes.

As a result, for example, in the case of computers having lower computing power/smaller memory size, a high number of slices or images with a large matrix size (e.g. 512×512 pixels) may nevertheless be reconstructed. A compromise that may be adopted, for example, is a somewhat higher SNR loss with a smaller memory, because the smaller memory may process fewer principal components. However, what may be advantageous is the fact that the SNR loss rises very continuously with a reduction of the number M and does not exhibit large jumps, as long as approximately M>N/5 (here and hereinafter a lower limit M_min may be determined from the known criteria for a minimum quality that may not be undershot). If this secondary condition is contravened, the system may, for example, refuse to carry out the measurement.

As a result, in the case of a given memory, measurement parameters such as number of slices and matrix size and acceleration factors for gradual SNR loss may be exchanged, which does not appear to be possible in the case of the methods specified in http://epub.ub.uni-muenchen.de/12456/1/BA_Berger.pdf since these methods use a fixed number of principal components for satisfying a quality criterion. If this number would lead to the memory being exceeded, however, the compromise described above may not be realized with these methods.

An implementation would use the PCA, for example, if the reconstruction of the original channels exceeds the power of the reconstruction computer RECON. The number of principal components M used and the question of whether the method is used at all may therefore be made dependent on properties of the reconstruction system. The model that predicts the computing power/memory requirement may be used to restrict the number of principal components to an extent such that the reconstruction may be effected with a given memory.

Besides the memory capacity, other criteria such as reconstruction times (e.g., processor power) may also be used (e.g., alone or in addition) to determine the number M.

The method also affords the advantage over the methods described in http://epub.ub.uni-muenchen.de/12456/1/BA_Berger.pdf that the memory (if the use of the original channels would exceed the memory requirement) may always be fully utilized to capacity, and the SNR loss may be minimized in comparison with the use of a fixed criterion from http://epub.ub.uni-muenchen.de/12456/1/BA_Berger.pdf (which may select fewer principal components than may be processed by the memory).

The customer may also set parameters (also referred to as high-level parameters hereinafter) such as speed and/or quality. The system decides how many principal components are used (e.g., the methods in http://epub.ub.uni-muenchen.de/12456/1/BA_Berger.pdf may be employed) based on the set parameters.

Boundary conditions may arise from the nature of the measurement. In this regard, measurements having interactive character may be reconstructed faster than measurements that, after the end of the image calculation, are initially communicated into an archiving system (PACS) for later diagnosis.

According to one or more of the present embodiments, there is a dynamic relationship between the number of selected modes or principal components and other properties of the MRT measuring system. A dynamic degree-of-compression control that allows the image quality to be optimized depending on available system resources is possible as a result.

Figure 8:
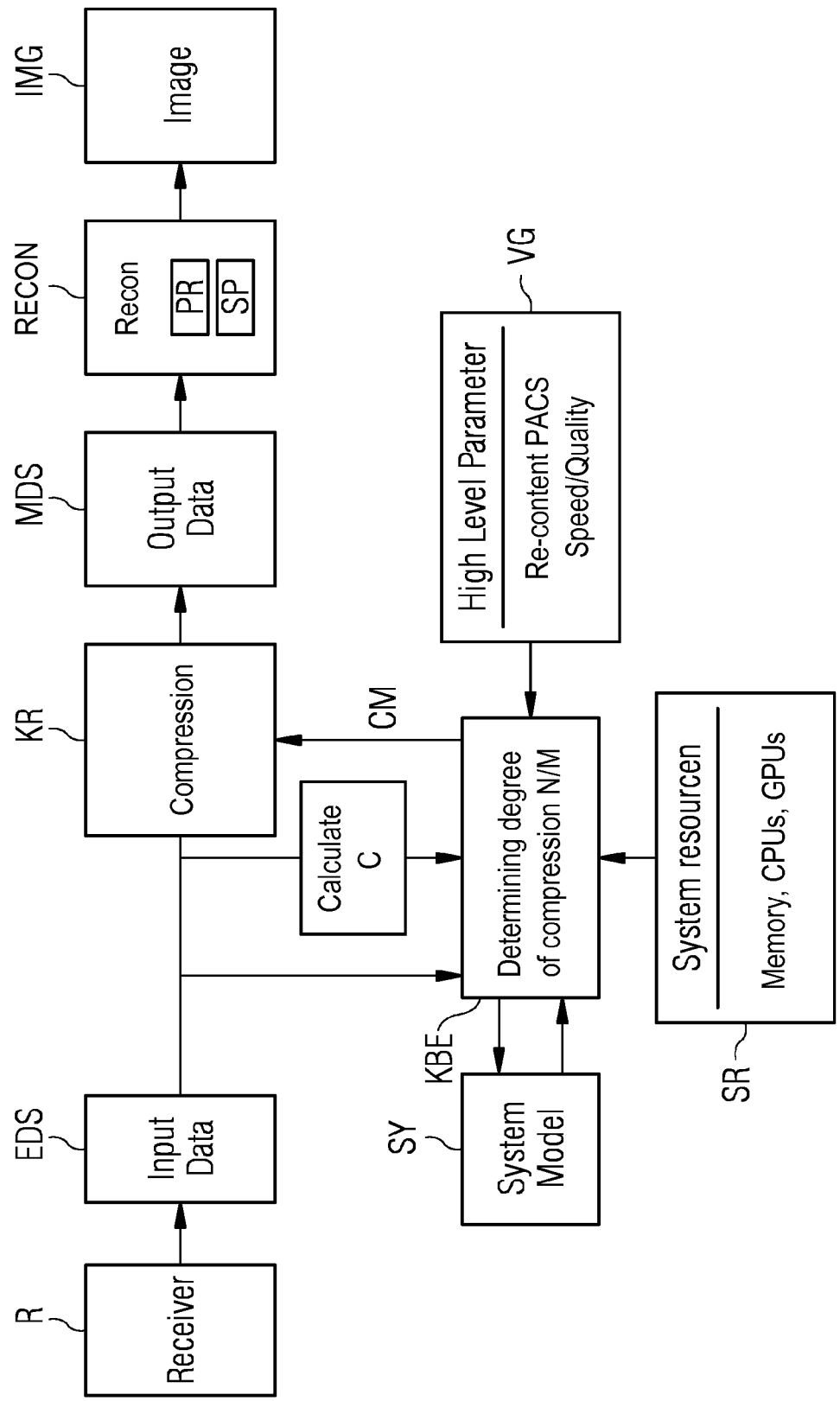
FIG. 8 schematically shows one embodiment of a method for determining a degree of compression $K=M/N$ for a compression of signal data sets generated by N coils of an MRT array to M mode data sets.

In the example of a configuration of one or more of the present embodiments in FIG. 8, a receiver R (e.g., including a coil array 4 having a plurality of coils 40; e.g. a local coil array and/or a body coil) receives signals (SIG) from a region K to be examined such as, for example, the trunk K of a body 105 (said trunk being illustrated outside the MRT in FIG. 1 and being displaceable into the volume V) and forwards them as reception signal data sets EDS (input data) to a degree-of-compression determining device KBE and to a compression computer KR.

The degree-of-compression determining device KBE determines, based on one or a plurality of different parameters VG, SY, SR known to the degree-of-compression determining device or input manually by a user, a ratio N/M (e.g., a desired ratio) of the number N of N reception signal data sets EDS, generated from signals SIG from the body region K received by a plurality of coils 40 (e.g., if appropriate with amplification, AD conversions etc.), to a smaller (M<N) number M of mode data sets MDS. M is also designated as modes or further processing channels or principal components.

Possible parameters for defining the (desired) ratio N/M are, for example, system resources SR such as memory SP of an image processing computer RECON that is available for the image reconstruction and/or computing power or processor power of at least one processor PR (e.g., CPUs, GPUs) of the image processing computer RECON that is available for the image reconstruction, and/or predetermined stipulations (e.g., "high-level parameters") VG such as the expected image reconstruction time required for image reconstruction using the image processing computer, a required image reconstruction time received or selected as input of a user of the MRT and maximally accepted by the user, the permissible signal-to-noise ratio loss of the image reconstruction, and/or parameters SY from a system model (e.g., of the image processing), and/or the number of coils 40 of an array L (e.g., a local coil array).

For example, if the compression method is based on PCA, a matrix C in the form of an eigenvector matrix may also be determined.

After the (desired) ratio N/M has been defined by the degree-of-compression determining device KBE, the matrix CM is calculated. The matrix CM (e.g., $[CM]_{N \times M}$) may be used to generate output data in the form of mode data sets MDS from input data in the form of reception signal data sets EDS using a compression computer KR. From M mode data sets, using an image processing computer RECON (e.g., an MRT image processing computer with memory SP and processor PR illustrated in a simplified manner), an image IMG of a region K of the body 105 may be generated (e.g., "reconstructed") and stored or output on a screen, for example.

Figure 9:
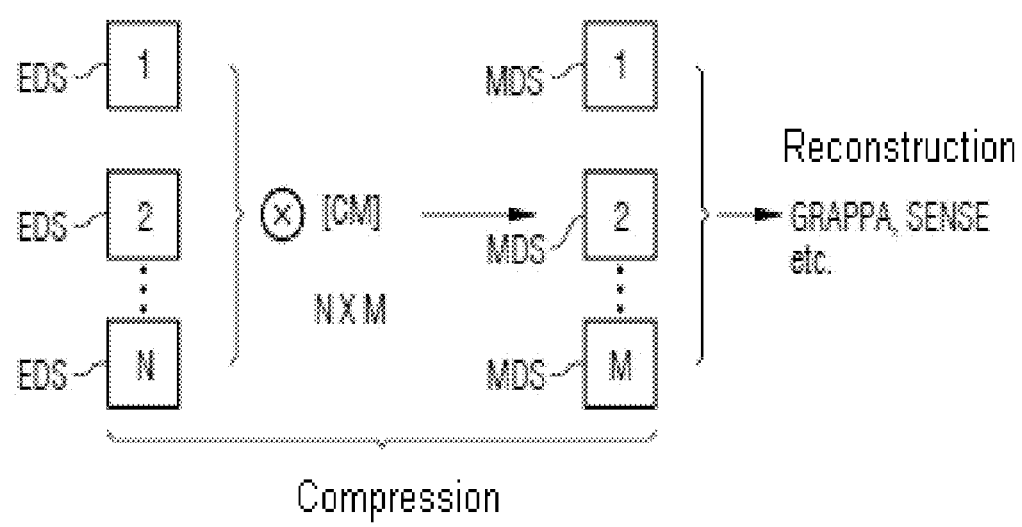
FIG. 9 schematically shows a use according to one embodiment of a reduction matrix $CM_{(N \times M)}$ for the compression of signal data sets generated by N coils of an MRT array to M mode data sets.

FIG. 9 schematically shows in a simplifying manner the use of a reduction matrix $[CM]_{N \times M}$ for compressing N signal data sets EDS received (e.g., if appropriate, also amplified, digitized, etc.) using N coils (1, 2 . . . N) of an MRT coil array 4 from a region (e.g., trunk K) of a body to M and less than N mode data sets MDS that may be used for the subsequent MRT image reconstruction. The mode data sets MDS may be used for an image reconstruction using, for example, methods such as GRAPPA, SENSE, etc.

Further details concerning the background and possible application of one or more of the present embodiments are evident from DE102005018814A1, which is hereby incorporated by reference as part of the application and is cited below.

FIG. 1 shows a schematic illustration of a magnetic resonance imaging or nuclear spin tomography appliance for generating a nuclear spin image of an object according to one or more of the present embodiments. In this case, the construction of the nuclear spin tomography appliance corresponds to the construction of a conventional tomography appliance. A basic field magnet 1 generates a strong magnetic field, constant over time, for polarizing or aligning the nuclear spins in the examination region of an object, such as, for example, a part of a human body to be examined. The high homogeneity of the basic field magnet that is required for the nuclear spin resonance measurement is defined in a measurement volume V, into which the parts of the human body to be examined are introduced. In order to support the requirements in terms of homogeneity and, for example, in order to eliminate time-invariable influences, shim plates composed of ferromagnetic material are fitted at a suitable location. Time-variable influences are eliminated by shim coils 2 driven by a shim power supply.

A gradient coil system 3 that includes a plurality of windings, partial windings, is inserted into the basic field magnet 1. An amplifier supplies each partial winding with current for generating a linear gradient field in the respective direction of the Cartesian co-ordinate system. The first partial winding of the gradient field system 3 generates a gradient $G_x$ in the x-direction, the second partial winding generates a gradient $G_y$ in the y-direction, and the third partial winding generates a gradient $G_z$ in the z-direction. Each amplifier includes a digital-to-analog converter driven by a sequence control 18 for generating gradient pulses at the right time.

Situated within the gradient field system 3, there is a radio frequency antenna 4 that converts the radio frequency pulses emitted by a radio frequency power amplifier into an alternating magnetic field for exciting the nuclei and aligning the nuclear spins of the object to be examined or of the region of the object to be examined. The radio frequency antenna 4 includes one or a plurality of RF transmission coils and a plurality of RF reception coils in the form of, for example, a linear arrangement of component coils in PPA imaging systems. The RF reception coils of the radio frequency antenna 4 also convert the alternating field arising from the precessing nuclear spins (e.g., the nuclear spin echo signals caused by a pulse sequence including one or a plurality of radio frequency pulses and one or a plurality of gradient pulses) into a voltage that is fed to a radio frequency reception channel 8 of a radio frequency system 22 via an amplifier 7. The radio frequency system 22 also includes a transmission channel 9, in which the radio frequency pulses for exciting the nuclear magnetic resonance are generated. In this case, the respective radio frequency pulses are represented digitally as a sequence of complex numbers in the sequence control 18 on account of a pulse sequence predetermined by the installation computer 20. This sequence of numbers is fed as real and imaginary part via a respective input 12 to a digital-to-analog converter in the radio frequency system 22 and is fed from there to a transmission channel 9. In the transmission channel 9, the pulse sequences are modulated onto a radio frequency carrier signal, the base frequency of which corresponds to the resonant frequency of the nuclear spins in the measurement volume.

The changeover from transmission to reception operation is brought about via a transmission-reception switch 6. The RF transmission coil of the radio frequency antenna 4 radiates the radio frequency pulses for exciting the nuclear spins into the measurement volume V and samples resulting echo signals via the RF reception coils. The nuclear resonance signals correspondingly obtained are phase-sensitively demodulated in the reception channel 8 of the radio frequency system 22 and are converted into the real part and imaginary part of the measurement signal via a respective analog-to-digital converter. From the measurement data obtained in this way, an image is reconstructed by an image computer 17. The measurement data, the image data and the control programs are managed by the installation computer 20. On the basis of a predetermined stipulation with control programs, the sequence control 18 controls the generation of the respectively desired pulse sequences and the corresponding sampling of the k-space. For example, the sequence control 18 controls the switching of the gradients at the right time, the emission of the radio frequency pulses with a defined phase and amplitude, and the reception of the nuclear resonance signals. The time base for the radio frequency system 22 and the sequence control 18 is provided by a synthesizer 19. The selection of corresponding control programs for generating a nuclear spin image and the representation of the nuclear spin image generated are effected via a terminal 21 comprising a keyboard and one or more screens.

In order to be able to carry out PPA measurements by an MRT appliance, it is standard practice (e.g., in the phase coding direction (y-direction, LIN)) not to use an individual coil, but rather an arrangement including a plurality of coils. The component coils are connected to form a coil array and arranged in a mutually adjacent or overlapping manner. As a result, likewise adjoining overlapping coil images may be recorded. If the acquisition time is not intended to be prolonged with improvement of the SNR, the coils of a coil array are to receive simultaneously. Consequently, each coil has its own receiver including preamplifier, mixer and analog-to-digital converter. This hardware is very expensive, which in practice, leads to a limitation of the number of coils in an array. Arrays including a maximum of 32 individual coils are currently provided.

However, the intention is to significantly increase the number of component coils of a PPA coil array. Systems having up to 96 input channels are in the trial phase. It has been found that this high number of PPA coils drastically increases the requirements made of the hardware and software of the installation computer or the system control, for example, with regard to computing power and memory space. In some PPA methods, this rise in the power requirement is particularly high, for example, in the case of GRAPPA, which has a more than square dependence of the image reconstruction computing time on the number of component coils involved. It is an aim of one or more of the present embodiments to accelerate the GRAPPA image reconstruction method such that the computing time is kept within acceptable limits even with a high number of coils.

Figure 4A:
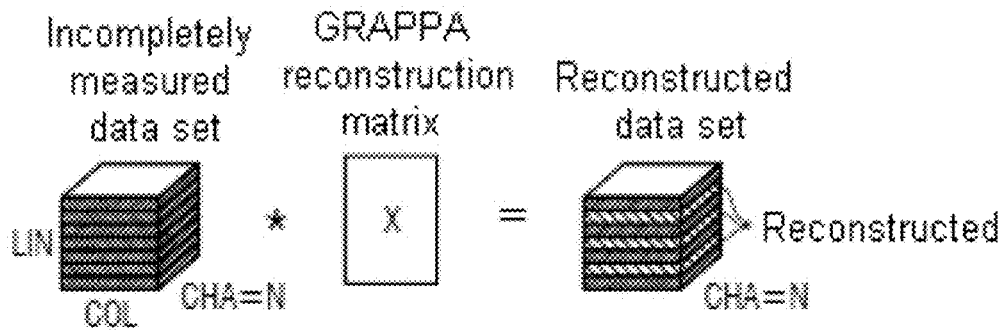
FIG. 4A schematically shows the effect of a conventional GRAPPA reconstruction matrix on a block of incomplete data sets.
Figure 4B:
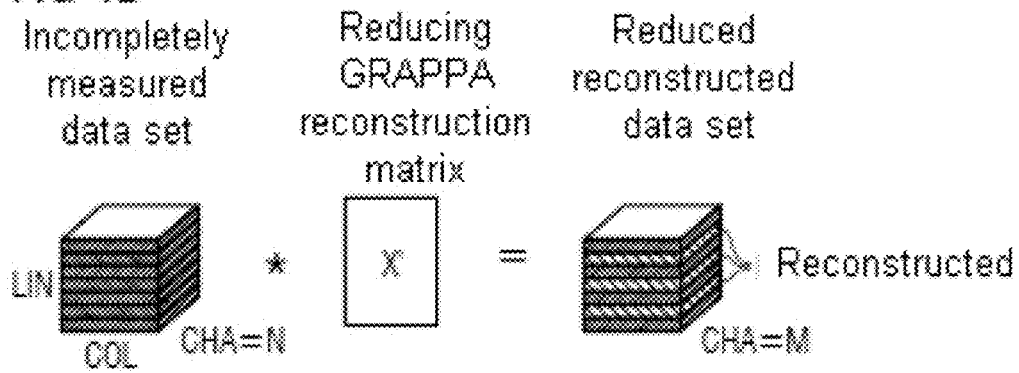
FIG. 4B shows the effect of a reducing GRAPPA reconstruction matrix on a block of incomplete data sets.

This is achieved by the total number of channels (PPA coils) involved in the GRAPPA image reconstruction being reduced on the output side by a process that involves no longer mapping all N coils involved onto N coils using an N×N GRAPPA reconstruction matrix (X) (e.g., FIG. 4A) but rather in accordance with FIG. 4B based on a number N of input channels 40 (FIG. 5) now mapping onto a smaller number M of output channels using a reduced N×M GRAPPA reconstruction matrix (X'). Even a small reduction of the output channels reduces the complexity of the GRAPPA reconstruction matrix such that the required computing time for the GRAPPA reconstruction is greatly reduced.

By a process, therefore, in which all N incompletely measured data sets are no longer completed and Fourier transformed by GRAPPA reconstruction, rather only a subset M of incomplete data sets is formed from the N incompletely measured data sets. This reduced amount of incomplete data sets is then completed, Fourier transformed and superposed by GRAPPA reconstruction. The computing time overall may be significantly reduced. N and M are positive integers, where N>M holds true.

The formation, according to one or more of the present embodiments, of the subset M, which is designated as "reduction" hereinafter, is based on the application of an N×M reduction matrix 45, which may be formed in various ways and according to different viewpoints.

One possible method for determining such an N×M reduction matrix includes the eigenvector analysis of a covariance matrix 41 formed from the N incompletely measured data sets. This method, also designated as a PCA algorithm (principal component analysis PCA), is explained below for a channel reduction from N=4 to M=2 channels with reference to FIG. 5. N=4 measured incomplete data sets 40 of four component coils arranged in the phase coding direction (four input channels) constitute the initial basis.

The respective data set 40 is designated by A, B, C and D and in each case includes an identical number of values (e.g., measured frequency entries or coefficients of the k-matrix).

These data sets A, B, C, D are then statistically compared with one another by a covariance matrix 41 cov( ) being formed. The covariance cov(A, B, C, D) describes the degree of mutual variation (or covariation) of the measured-value series A, B, C and D and is the sum of the averaged deviation products of the variables involved. A subsequent eigenvector analysis of the covariance matrix makes it possible to determine the eigenvectors 42 of the PPA coil system, which written next to one another form the eigenvector matrix 48 eig( ) of the system, and the eigen values 43 corresponding to the respective eigenvectors 42. The magnitude of the eigen values 43 represents the information content of the respective eigenvector 42.

If the eigenvectors 42 are sorted in accordance with their eigen values 43 according to magnitude (e.g., highest eigen value on the far left, lowest eigen value on the far right), then the eigenvector matrix 48 acquires an importance gradation of the columns (e.g., eigenvectors 42) from left to right.

If the intention then is to perform a channel reduction from the N=4 channels to M=2 channels, for example, the M=2 left eigenvectors, which taken together form the N×M reduction matrix 45 of this channel reduction, are chosen with the minimum possible loss of information (e.g., the remaining N−M=4−2=2 eigenvectors are discarded). The reduction coefficients form the content of the reduction matrix 45.

If the N×M reduction matrix 45 thus obtained is applied to the N incomplete measured data sets A, B, C, D (e.g., in the sense of a matrix multiplication of the matrices 44 and 45), M reduced data sets $\alpha$, $\beta$ are obtained, which in the form of a matrix 46, form M output channels.

The matrix 44 is generated by stringing together the measured values of A, B, C and D, the order in which these measured values are listed being irrelevant, as long as this takes place in the same way for all the channels A, B, C and D. The number of the measured values may amount to thousands and is indicated by dots. Although the reduced data sets $\alpha$, $\beta$ obtained contain in each case the same number of measured values as A, B, C or D, the reduced data sets $\alpha$, $\beta$ each inherently no longer constitute real measurement series since as a result of the reduction, the values of A, B, C and D have been reduced and mixed to be precise such that maximum image information is maintained during the reduction.

However, each of the reduced data sets $\alpha$, $\beta$ is inherently still incomplete to the same extent as A, B, C or D and first is to be completed by GRAPPA reconstruction before M-variants of a complete image 34 in the space domain may be obtained by Fourier transformation.

Figure 6:
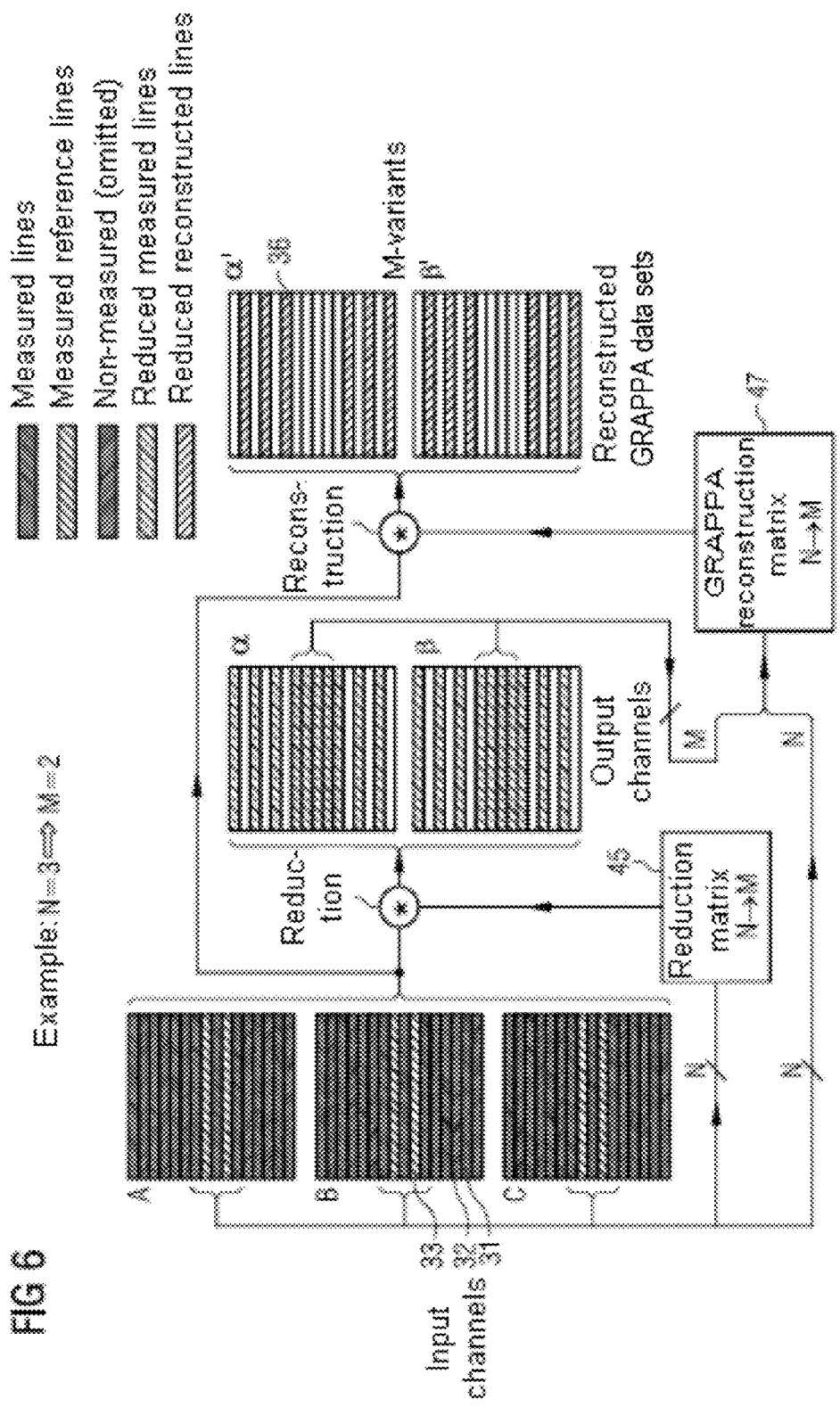
FIG. 6 schematically shows the reduction according to one embodiment of three input channels to two output channels using a reduction matrix and a GRAPPA reconstruction matrix.

An overview of one embodiment of a method is provided by FIG. 6, which schematically illustrates a reduction from three input channels A, B, C to two output channels $\alpha$, $\beta$.

Each input channel A, B, C includes ten measured lines 31, 33. Two lines in the center represent reference lines (e.g., calibration data points 33). Six lines 32 were omitted for the purpose of the PPA technique, for which reason A, B, C are incomplete.

As a result of the application of an N×M reduction matrix to A, B, C, specific values of A, B, C are selected and combined such that only two reduced data sets $\alpha$, $\beta$ are obtained. $\alpha$, $\beta$ are incomplete to the same extent as A, B and C (e.g., six omitted lines 32 in each case). The six lines respectively omitted from $\alpha$ and $\beta$ may be reconstructed, however, on the basis of a GRAPPA reconstruction using an N×M GRAPPA reconstruction matrix 47, as a result of which reconstructed GRAPPA data sets $\alpha'$, $\beta'$ are obtained. For this purpose, according to the GRAPPA method, reconstruction coefficients are determined to be precise both taking account of all measured lines of the N input channels A, B, C and taking account of the lines of the M output channels $\alpha$, $\beta$ obtained by the cut of the reduction. As shown in FIG. 6, the lines of the reduced data sets $\alpha$, $\beta$ are staggered in relation to the reconstructed lines of the reconstructed GRAPPA data sets $\alpha'$, $\beta'$ such that a combination of $\alpha$ and $\alpha'$, and $\beta$ and $\beta'$, respectively, in each case forms a complete data set again that in accordance with GRAPPA after Fourier transformation in the space domain, produce complete images 34 that are combined pixel by pixel in the space domain This ultimately leads to a GRAPPA-corresponding aggregate image 35 (e.g., high SNR) with reduced computing time overall, since instead of N only M output channels are considered as a result of the reduction.

However, as well as the GRAPPA reconstruction, in the case of a reduction according to one or more of the present embodiments, the reduction itself (e.g., the application of the reduction matrix to the data sets of the input channels (matrix multiplication 44*45)) also costs computing time that is to be invested again, but overall does not have a highly detrimental effect on the computing time saving.

The method experiences a further detrimental effect on the computing time saving when determining the reduction matrix 45 based on the PCA algorithm since the formation of the covariance matrix 41 constitutes a computing-time-intensive step (e.g., all the measured values of all N input channels A, B, C, D are to be compared with one another).

For this reason, within the scope of the present embodiments, alternatives are proposed for determining a reduction matrix 45 that leads to an expedient compromise between computing time saving and resulting image quality.

In this regard, the reduction matrix 45 may be determined, for example, based on an SNR analysis of the component coils 40 involved. It is advantageous with the aim of saving computing time to keep the number of reduction coefficients to a minimum. Just a single reduction coefficient per reduction matrix column would be advantageous since, in such a case, the reduction step would not require any more computing power in the narrower sense (e.g., the corresponding values of the data matrix 44 would be transferred to the matrix 46).

It may be advantageous to carry out the method according to one or more of the present embodiments in a cascaded manner, such that, for example, the N output channels have been obtained from a preceding reduction already performed. It may be advantageous to combine the reduction matrix and the reconstruction matrix of each cascade.

In the case of cascaded application, when determining the first reduction matrix 45, it may be taken into consideration that the N incomplete data sets α, β reduced in advance, depending on the choice of slice to be recorded, contain maximum PPA coding information.

Figure 7:
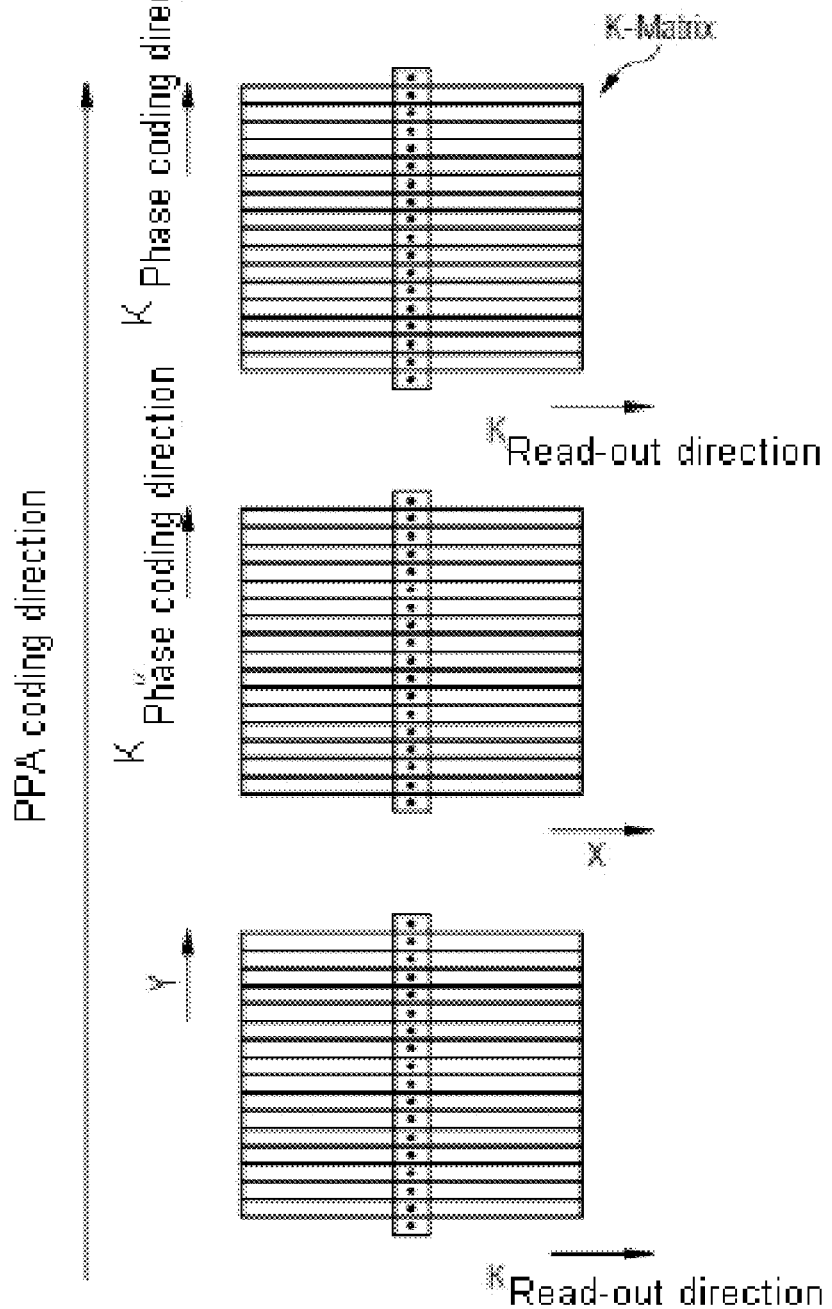
FIG. 7 schematically shows central K-space segments orthogonally with respect to the PPA coding direction, which may be used with regard to maintain maximum PPA coding information in the PCA algorithm.

In the case of a PCA algorithm, this may be done by forming the covariance matrix 41 on the basis of central columns or central segments of the k-matrix, which are situated in the direction of the PPA coding direction. This is illustrated in FIG. 7, in which the central segment represents a vector of the k-matrix in the PPA coding direction. The values of the vector are symbolized by dots in three different forms of representation: phase coding direction and read-out direction in the frequency domain (k-space); phase coding direction in the k-space and read-out direction in the space domain x; and phase coding direction in the space domain y and read-out direction in the k-space.

Further combinations are possible as long as the different, respectively neighboring segments are considered or compared orthogonally with respect to the PPA coding direction. In this case, it should be noted that the method according to one or more of the present embodiments may also be applied in the case of two-dimensional PPA coding (e.g., integrated parallel acquisition technique square iPAT$^2$), for example, in two mutually orthogonal phase coding directions.

In the case where the PPA measurements are carried out by MRT appliances having a coil system with mode matrix (e.g., total imaging matrix (TIM)), the reduction matrix 45 may be determined based on the properties of the mode matrix. Mode matrix coil systems (e.g., comprehensively described in US 2004/0193038 A1) provide a very high number of coil elements (e.g., component coils). Neighboring coils may be combined to form groups in a hardware-based manner and are thus combined differently (e.g., if appropriate, with different combination coefficients). In this way, the redundancy in the spatial coverage of the coil sensitivities may be utilized with regard to a channel reduction. A grouping of three leads, for example, to a primary channel, a secondary channel and a tertiary channel may be provided. Solely taking account of primary channels as a result of the reduction would therefore lead to a channel reduction by the factor 3.

In the case of such PPA coil systems with mode matrix (which therefore have a hardware-based grouping of component coils), the reduction matrix 45 may be determined in a simple manner using a weighted selection of coefficients that form the modes or a subset of the modes of such a system. Since the mode matrix of such a TIM system in some ways represents the reduction matrix of the method according to one or more of the present embodiments, the computing time for determining the reduction matrix may be saved. For this reason, the method according to one or more of the present embodiments may be applied particularly advantageously with the use of TIM systems.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for generating an image with N reception signal data sets generated based on signals received from a plurality of coils of a magnetic resonance tomography appliance from a region of a body to be examined using an image processing computer, the method comprising:
    defining, using a degree-of-compression determining device, a ratio N/M of a number N of the N reception signal data sets generated from the signals received by the plurality of coils to a smaller number M of mode data sets taking account of a plurality of parameters, the plurality of parameters at least also representing system resources of the image processing computer, wherein a parameter of the plurality of parameters comprises a required image reconstruction time received as input of a user of a magnetic resonance tomography (MRT) device and maximally accepted by the user;
    compressing, using a compression computer, the N reception signal data sets into the M mode data sets; and
    generating, using the image processing computer, an image of the region of the body using the M mode data sets.

2. The method of claim 1, wherein an additional parameter of the plurality of parameters comprises a memory of the image processing computer that is available for an image reconstruction.

3. The method of claim 1, wherein an additional parameter of the plurality of parameters comprises computing power or processor power of at least one processor of the image processing computer that is available for an image reconstruction.

4. The method of claim 1, wherein an additional parameter of the plurality of parameters comprises an expected image reconstruction time required for image reconstruction using the image processing computer.

5. The method of claim 1, wherein an additional parameter of the plurality of parameters comprises a permissible signal-to-noise ratio loss as a result of the image generation.

6. The method of claim 1, further comprising an estimated expected image reconstruction time required for image reconstruction using the image processing computer before the ratio N/M is defined.

7. The method of claim 1, wherein the generating comprises utilizing system resources of the image processing computer to a predetermined extent or percentage proportion.

8. The method of claim 7, wherein the system resources comprise processor power of the image processing computer that is available for an image reconstruction, memory of the image processing computer that is available for the image reconstruction, or a combination thereof.

9. The method of claim 1, wherein the M mode data sets are in each case further processing channels, principal components, k-space data sets, or a combination thereof.

10. The method of claim 1, wherein the method is performed based on a partial parallel acquisition.

11. The method of claim 1, further comprising performing, using a reduction matrix and a matrix multiplication, a compression of reception signal data sets generated by N coils of a magnetic resonance tomography (MRT) local coil array to the M mode data sets usable for a subsequent MRT image reconstruction, wherein M is less than N.

12. The method of claim 11, wherein the reduction matrix is an eigenvector matrix.

13. The method of claim 12, wherein the reduction matrix is an eigenvector matrix for a PCA-based compression method.

14. The method of claim 1, wherein the M mode data sets are principal component data sets.

15. The method of claim 14, wherein the principal components data sets are of a principal component analysis.

16. An apparatus for generating an image with signals received by coils of a magnetic resonance tomography appliance, the apparatus comprising:
   N coils configured for receiving signals from a region of a body to be examined, N reception signal data sets being generatable from the received signals;
   a degree-of-compression determining device configured to define a ratio N/M of a number N of reception signal data sets to a smaller number M of mode data sets to be processed further taking account of a plurality of parameters, the plurality of parameters at least also representing system resources of an image processing computer, wherein a parameter of the plurality of parameters comprises a required image reconstruction time received as input of a user of a magnetic resonance tomography (MRT) device and maximally accepted by the user;
   a compression computer configured to generate the M mode data sets from the reception signal data sets from the N coils; and
   an image processing computer configured for generating the image of the region of the body from the mode data sets.

17. The apparatus of claim 16, wherein an additional parameter of the plurality of parameters comprises a memory of the image processing computer that is available for an image reconstruction.

18. The apparatus of claim 16, wherein an additional parameter of the plurality of parameters comprises computing power or processor power of a processor of the image processing computer that is available for an image reconstruction.

19. The apparatus of claim 16, wherein an additional parameter of the plurality of parameters comprises an expected image reconstruction time required for image reconstruction using the image processing computer.

20. The apparatus of claim 16, wherein an additional parameter of the plurality of parameters is a permissible signal-to-noise ratio loss as a result of the image generation.

21. The apparatus of claim 16, wherein the system resources of the image processing computer are useable to a predetermined extent or proportion for generating the image of the region of the body.

22. The apparatus of claim 21, wherein the system resources comprises processor power of the image processing computer that is available for an image reconstruction, memory of the image processing computer that is available for the image reconstruction, or a combination thereof.

23. The apparatus of claim 16, wherein the M modes are in each case further processing channels, principal components, k-space data sets, or a combination thereof.

24. The apparatus of claim 16, wherein the apparatus is configured for partial parallel acquisition.

25. The apparatus of claim 16, further comprising a reduction matrix configured for a compression, by matrix multiplications, of N reception signal data sets generated by the N coils of a magnetic resonance tomography (MRT) local coil array to the M mode data sets usable for a subsequent MRT image reconstruction, and wherein M is less than N.

26. The apparatus of claim 25, wherein the reduction matrix is an eigenvector matrix.

27. The apparatus of claim 26, wherein the reduction matrix is for a PCA-based compression.

28. The apparatus of claim 16, wherein the M mode data sets are principal component data sets.

29. The apparatus of claim 28, wherein the M mode data sets are component data sets for principal components of a PCA or principal component analysis.

* * * * *